United States Patent [19]
Tlaskal

[11] Patent Number: 6,020,836
[45] Date of Patent: Feb. 1, 2000

[54] SIGMA-DELTA ANALOGUE-TO-DIGITAL CONVERSION CIRCUITS

[75] Inventor: Ondrej Tlaskal, Reading, United Kingdom

[73] Assignee: Racal Research Limited, Berkshire, United Kingdom

[21] Appl. No.: 08/881,795

[22] Filed: Jun. 24, 1997

[30] Foreign Application Priority Data

Jun. 25, 1996 [GB] United Kingdom .................... 9613230

[51] Int. Cl.[7] .................................................. H03M 3/00
[52] U.S. Cl. ......................................... 341/143; 341/155
[58] Field of Search ................................... 341/143, 155, 341/118, 120, 144; 324/142, 74

[56] References Cited

U.S. PATENT DOCUMENTS

| | | | |
|---|---|---|---|
| 5,124,703 | 6/1992 | Kaneaki et al. | 341/77 |
| 5,191,331 | 3/1993 | Karema et al. | 341/131 |
| 5,736,848 | 4/1998 | De Vries et al. | 324/142 |
| 5,736,950 | 4/1998 | Harris et al. | 341/143 |
| 5,742,246 | 4/1998 | Kuo et al. | 341/143 |
| 5,745,061 | 4/1998 | Norsworthy et al. | 341/131 |

FOREIGN PATENT DOCUMENTS

| | | | |
|---|---|---|---|
| 2281828 | 3/1995 | United Kingdom | H03M 3/00 |
| WO95/34955 | 12/1995 | WIPO | H03M 3/02 |

OTHER PUBLICATIONS

Eynde et al., "Analog Interfaces for Digital Signal Processing Systems," pp. 85–119 (Kluwer Academi Publication, London 1993).

Jantzi et al., "A Fourth–Order Bandpass Sigma–Delta Modulator," *IEEE J. of Solid–State Cir.*, 28:3, pp. 282 291 (1993).

Schreier et al., "Bandpass Sigma–Delta Modulation," *Electronics Letters*, 25:23, 1560–1561 (1989).

Signor et al., "Switched–Capacitor Bandpass Delta–Sigma A/D Modulation at 10.7 MHz," *IEEE J. of Solid State Circuits*, 30:3, 184–192 (1995).

Thurston et al., "Bandpass Implementation of the Sigma–Delta A–D Conversion Technique," IEE Conference Publication No. 343 (Sep. 17–19, 1991).

Thurston et al., "Dynamic Overload Recover Mechanism for Sigma Delta Modulators," IEEE Conferenc Publication No. 393 (Jul. 6–8, 1994).

Tröster et al., "An Interpolative Bandpass Converter on a 1.2–$\mu$m BiCMOS Analog/Digital Array," *IEEE J. o Solid–State Circuits*, 28:4 (1993).

*Primary Examiner*—Brian Young
*Attorney, Agent, or Firm*—Leydig, Voit & Mayer, Ltd.

[57] ABSTRACT

A third-order sigma-delta analogue-to-digital conversion circuit has a filter comprising the cascaded arrangement of three individual filter circuits, a quantization circuit and a monitoring circuit. The monitoring circuit detects for a predetermined, periodic pattern in the output bit stream. The periodicity of this pattern is $$\frac{f_c}{f_r},$$

when $f_c$ is the converter sampling frequency and $f_r$ is the resonant frequency of the filter. If the pattern is detected, the monitoring circuit resets the filter.

9 Claims, 1 Drawing Sheet

SIGMA-DELTA ANALOGUE-TO-DIGITAL CONVERSION CIRCUITS

BACKGROUND OF THE INVENTION

This invention relates to sigma-delta analogue-to-digital conversion circuits, particularly, though not exclusively, higher order sigma-delta analogue-to-digital conversion circuits; that is conversion circuits of the order two or more.

A typical higher order sigma-delta analogue-to-digital conversion circuit has a filter comprising a plurality of individual filter circuits, such as LC filter circuits, SC filter circuits or SI filter circuits arranged in a cascaded configuration.

Analogue-to-digital conversion circuits of this kind are conditionally stable; that is, they operate satisfactorily provided the input amplitude is below a critical level. Once this level is exceeded, the sigma-delta converter starts to oscillate and loses its noise shaping features. Then even if the amplitude is decreased the coverter will continue to oscillate.

Hitherto, it has been customary to include additional analogue circuitry to monitor different internal parameters in the conversion circuit and to initiate appropriate remedial action should instability be detected. However, such additional circuitry adds unduly to the overall complexity and power consumption of the conversion circuit.

BRIEF SUMMARY OF THE INVENTION

According to the invention there is provided a sigma-delta analogue-to-digital conversion circuit having an input for receiving an analogue input signal and an output for outputting a digital bit stream, and including monitoring means for detecting for a predetermined, periodic pattern in the digital bit stream.

DESCRIPTION OF THE DRAWINGS

A sigma-delta analogue-to-digital conversion circuit is now described, by way of example only, with reference to the accompanying drawings in which.

DESCRIPTION OF PREFERRED EMBODIMENT

Figure 1:
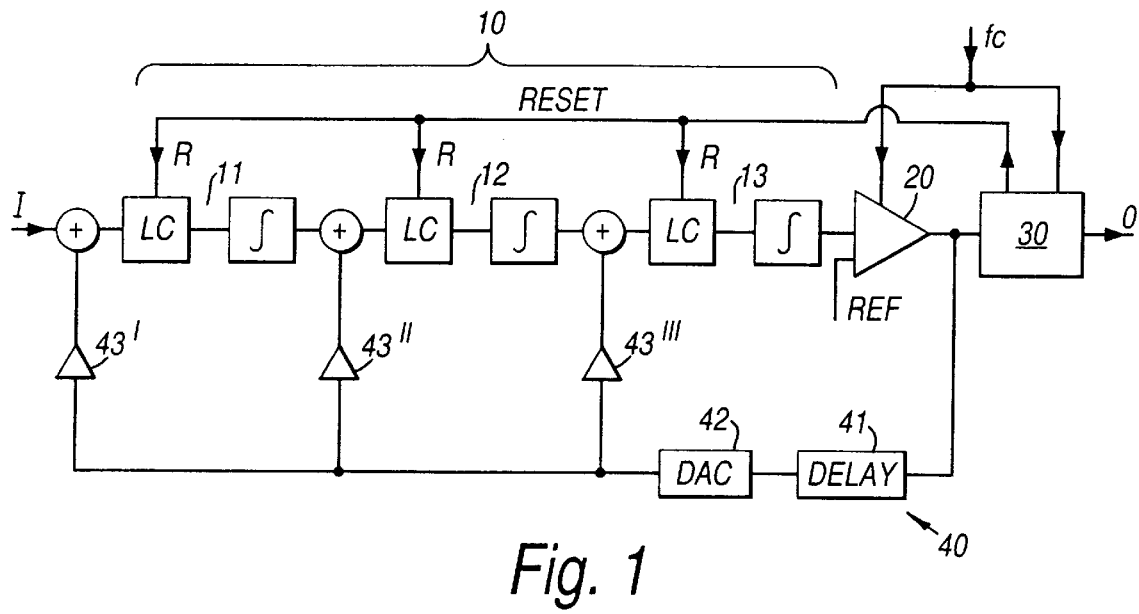
FIG. 1 is a block circuit diagram showing a third-order sigma delta analogue-to-digital conversion circuit according to the invention.

FIG. 1 shows a third-order, bandpass sigma-delta analogueto-digital conversion circuit.

The conversion circuit has an input I for receiving an analogue input signal, an output O for outputting a digital bit stream and includes the serial arrangement of a bandpass filter 10, a quantization circuit 20 and a monitoring circuit 30, interconnecting the input I and the output O.

The filter 10 comprises three, continuous-time, LC bandpass filter circuits 11,12,13 arranged in a cascaded configuration, the input to each filter circuit being coupled to the output of the quantization circuit 20 via a feedback loop 40 containing a delay 41, a digital-to-analogue conversion circuit 42 and a respective weighting circuit 43', 43", 43'''.

In this embodiment, the analogue input signal is sampled by the quantization circuit 20 which is supplied with clock pulses at the converter sampling frequency $f_c$. Alternatively, in the case when the filter circuit would have the form of a discrete-time filter operating in synchronism with the clock pulses, a dedicated sampling circuit would be connected between the input and the filter circuit.

As already explained, if the amplitude of the analogue input signal should exceed a critical level, there is a tendency for the loop to start oscillating at the resonant frequency $f_r$ of the LC filters. In these circumstances, the analogue-to-digital conversion circuit becomes unstable and loses its noise shaping capability. The instability may persist even if the input amplitude should subsequently fall below the critical level.

With a view to alleviating this problem, the monitoring circuit 30 detects for a characteristic, periodic pattern in the digital bit stream produced at the output of the quantization circuit 20 whenever the sigma-delta converter starts to oscillate in the manner described. Upon detection of this pattern, the monitoring circuit 30 outputs a reset signal R which is used to reset each filter circuit 11,12,13, thereby restoring the converter to stability.

In general, the periodicity of the characteristic, periodic pattern will be n bits/cycle, where n is the ratio $$\frac{f_c}{f_r}.$$

In this particular embodiment, each filter circuit 11,12,13 is tuned to a resonant frequency $f_r=\frac{1}{4}f_c$, and so the value of n is 4. In this example, the monitoring circuit 30 detects for the periodic pattern {1,1,0,0,1,1,0,0 . . . } in the output bit stream.

Figure 2:
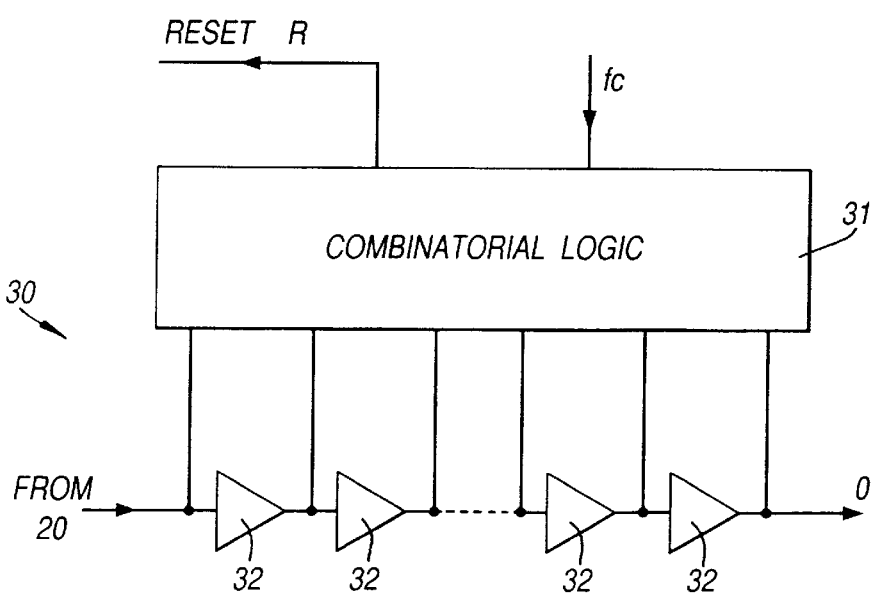
FIG. 2 is a block circuit diagram showing a monitoring circuit forming part of the conversion circuit of FIG. 1.

Referring to FIG. 2, the monitoring circuit 30 includes a combinatorial logic circuit 31 programmed to recognise the characteristic periodic pattern in the output bit stream. To this end, the output bit stream is passed through a serial arrangement of delay circuits 32, each imposing a delay of a single clock pulse $$\left(\frac{1}{f_c}\right),$$

and the logic circuit has a plurality of input ports arranged to monitor the instantaneous values of bits at the inputs to the delay circuits. By this means, the monitoring circuit 30 monitors the values of successive groups of consecutive bits in the output bit stream, where each successive group is shifted relative to the next by a single bit in the output bit stream, at the rate of the clock frequency $f_c$.

It will be appreciated that there may be more than one periodic pattern indicative of instability, and, in this case, the logic circuit 31 may be programmed to recognise any of these patterns and generate a reset signal R in response thereto.

The order of the sigma-delta analogue-to-digital conversion circuit is determined by the order of the filter. It will be appreciated that although the invention has been described in detail with reference to a third-order sigma-delta analogue-to-digital conversion circuit, the invention is equally applicable to sigma-delta, analogue-to-digital conversion circuits of any other order. The described sigma-delta, analogue-to-digital conversion circuits are advantageous in that the circuitry needed to maintain practical stability is less complex and consumes less power than that adopted hitherto.

What is claimed is:

1. A sigma-delta analogue-to-digital conversion circuit comprising,
    an input for receiving an analogue input signal, a filter, an output for outputting a digital bit stream, and
    monitoring means for detecting for a predetermined, periodic pattern in the digital bit stream and for maintaining stability of the conversion circuit upon detection by the monitoring means of said predetermined, periodic pattern.

2. A conversion circuit as claimed in claim 1, wherein said monitoring means is arranged to reset the filter upon detection by the monitoring means of said predetermined, periodic pattern.

3. A conversion circuit as claimed in claim 2, wherein said filter comprises a cascaded arrangement of filter circuits.

4. A conversion circuit as claimed in claim 3, wherein each said filter circuit is a continuous time filter circuit.

5. A conversion circuit as claimed in claim 4, wherein each said filter circuit comprises an LC filter circuit.

6. A conversion circuit as claimed in claim 3, wherein each said filter circuit is a discrete-time filter circuit.

7. A conversion circuit as claimed in claim 2, wherein said predetermined, periodic pattern has a period of n bits/cycles, wherein n is the ratio $$\frac{f_c}{f_r}$$

of the converter sampling frequency $f_c$ and the resonant frequency $f_r$ of the filter.

8. A conversion circuit as claimed in claim 2, wherein the filter is a bandpass filter.

9. A conversion circuit as claimed in claim 1, wherein said monitoring circuit comprises a combinatorial logic circuit for comparing the digital bit stream with said predetermined, periodic pattern.

* * * * *